(12) United States Patent
Kamimura

(10) Patent No.: US 6,545,301 B2
(45) Date of Patent: Apr. 8, 2003

(54) SOLID-STATE IMAGE SENSOR AND MANUFACTURING METHOD THEREFOR

(75) Inventor: Shinya Kamimura, Kitakatsuragi-gun (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/740,507

(22) Filed: Dec. 19, 2000

(65) Prior Publication Data

US 2001/0015428 A1 Aug. 23, 2001

(30) Foreign Application Priority Data

Feb. 22, 2000 (JP) ........................................ 2000-044297

(51) Int. Cl.⁷ ........................... H01L 29/78; H01L 33/08
(52) U.S. Cl. ........................................ 257/222; 257/223
(58) Field of Search ................................... 257/222, 223

(56) References Cited

U.S. PATENT DOCUMENTS 5,464,997 A    11/1995   Watanabe

FOREIGN PATENT DOCUMENTS

JP           6-169076         6/1994

*Primary Examiner*—Stephen D. Meier
(74) *Attorney, Agent, or Firm*—David G. Conlin; Steven M. Jensen; Edwards & Angell, LLP

(57) ABSTRACT

A horizontal transfer section is formed on a P-type semiconductor substrate. A floating diffusion layer for receiving signal charges from the horizontal transfer section and a detector MOSFET for detecting any potential change of the floating diffusion layer are further formed. This detector MOSFET has a gate electrode in which an opening is formed. The gate electrode extends toward the floating diffusion layer and the opening is positioned above the floating diffusion layer. As a result, a solid-state image sensor constituted as above, can reduce the area of the floating diffusion layer and can detect signal charges at high sensitivity.

4 Claims, 5 Drawing Sheets

SOLID-STATE IMAGE SENSOR AND MANUFACTURING METHOD THEREFOR

BACKGROUND OF THE INVENTION

The present invention relates to a solid-state image sensor such as CCD (Charge Coupled Device memory) having high detection sensitivity, and to a manufacturing method therefor.

FIG. 4A is a plan view showing main part of a CCD according to the prior art. In the figure, reference numeral 41 denotes a horizontal transfer section, 42 denotes a horizontal power output gate, 43 denotes a reset gate, 44 denotes a reset drain, 45 denotes a detector MOSFET (MOS Field Effect Transistor), 46 denotes a floating diffusion layer (hereinafter, referred to as FD), 47 and 57 denote contact holes, 48 denotes an aluminum line, and 50 denotes a gate electrode of the detector MOSFET 45. This detector MOSFET 45 is a part of a detector circuit for detecting potential changes of the FD 46. The FD 46 is formed of an $N^+$ layer, and the $N^+$ layer is made by exposing part where the FD 46 is to be formed with photoresist by patterning, and performing ion implantation to the exposed part.

FIG. 4B is a sectional view taken along the line B—B of FIG. 4A, where reference numeral 51 denotes a P-type semiconductor substrate and 52 denotes field oxide. As shown in FIG. 4B, a contact hole 47 is formed above the FD 46, and a contact hole 57 is also formed above an FD 46 side end portion of the gate electrode 50. The aluminum line 48 is formed at the contact holes 47, 57, by which the FD 46 and the gate electrode 50 are connected to each other by the aluminum line 48.

In the CCD of this constitution, a reset pulse voltage applied to a reset gate 43 is made high level to reset the FD 46, and the reset pulse voltage is made low level to transfer signal charges from the horizontal transfer section 41 to the FD 46. In this case, assuming that the entire capacitance containing the gate electrode 50 of the detector MOSFET 45 connected to the FD 46 is Ct and that the amount of transferred signal charges is Q, then there arises a potential change of $\Delta Vfd=Q/Ct$ in the FD 46 and the potential change is detected by the detector MOSFET 45. Also, when the gain of the detector circuit having the detector MOSFET 45 is assumed to be G, the detection sensitivity of the detector circuit becomes $\Delta Vout=G \cdot Q/Ct$, where a voltage change proportional to the signal charge Q is outputted to the detector circuit.

In this case, capacitances composing the Ct principally includes an FD—reset gate junction capacitance Cfr, an FD—horizontal output gate junction capacitance Cog, a gate capacitance Cg of the detector MOSFET, an FD—semiconductor substrate junction capacitance Cfd, an aluminum wiring capacitance Cmr and the like. That is, the entire capacitance Ct containing the gate electrode 50 of the detector MOSFET 45 connected to the FD 46 is Ct=Cfr+Cog+Cg+Cfd+Cmr. Therefore, if the gain G of the detector circuit is constant, then the detection sensitivity can be made higher more and more with Cfd smaller. Since the capacitance Cfd of the FD 46 can be considered proportional to the area of the FD 46, the area of the FD 46 needs to be reduced as much as possible in order to achieve a high detection sensitivity.

FIG. 5A is a plan view showing main part of another CCD according to the prior art, and FIG. 5B is a sectional view taken along the line 5B—5B of FIG. 5A. FIGS. 5A and 5B are different from the prior art example of FIGS. 4A and 4B in that a gate electrode 150 of a detector MOSFET 145 is formed so as to extend to above an FD 146, and that aluminum line 148 formed at one contact hole 147 interconnects the FD 146 and the gate electrode 150. Therefore, in FIGS. 5A and 5B, the same component parts as those of FIGS. 4A and 4B are designated by the same reference numerals and omitted in description.

For manufacturing methods of the prior art CCDs, because it is difficult to further reduce the area of the FD 46, 146, the detection sensitivity of the charge detector circuit cannot be enhanced. That is, there is a problem that signal charges transferred from the horizontal transfer section 41 to the FD 46 cannot be detected at high sensitivity. In more detail, since the FD 46, 146 and the contact hole 47, 147 are formed by patterning with photoresist, there has been a need for ensuring alignment margins d1, d2 for the FD 46, 146 and the contact hole 47, 147. The alignment margin d should be 0.2–0.4 μm or so, taking into consideration variations in line widths of the aluminum lines 48, 148 and the FD 46, 146 as well as in alignment. However, because the FD 46, 146 is sized about 1–2 μm□, the alignment margins d1, d2 are as large as 10–25% of the FD 46, 146, making it impossible to reduce the area of the FD 46, 146.

Therefore, an object of the present invention is to provide a CCD, as well as its manufacturing method, which makes it possible to reduce the area of the FD and to detect signal charges of the FD at high sensitivity.

In order to achieve the above object, there is provided a solid-state image sensor comprising: a first-conductive-type semiconductor substrate; a charge transfer section formed on the first-conductive-type semiconductor substrate; a second-conductive-type floating diffusion layer for receiving signal charges from the charge transfer section; and a detector transistor for detecting a potential change of the second-conductive-type floating diffusion layer, wherein an opening is formed in a gate electrode of the detector transistor;

the gate electrode of the detector transistor extends toward the second-conductive-type floating diffusion layer 26 and the opening 30a is positioned above the second-conductive-type floating diffusion layer 26.

In this solid-state image sensor according to the invention, since the opening formed in the gate electrode of the detector transistor is positioned above the floating diffusion layer of the second-conductive-type floating diffusion layer, forming a metal line above the opening of the gate electrode allows self alignment to be achieved, by which the second-conductive-type floating diffusion layer and the metal line are connected to each other. Therefore, the alignment margin between the second-conductive-type floating diffusion layer and the contact hole can be eliminated, so that the area of the second-conductive-type floating diffusion layer can be reduced. As a result, the junction capacitance between the second-conductive-type floating diffusion layer and the semiconductor substrate is decreased so that signal charges of the second-conductive-type floating diffusion layer can be detected at high sensitivity.

Also, there is provided a solid-state image sensor comprising: a first-conductive-type semiconductor substrate; a charge transfer section formed on the first-conductive-type semiconductor substrate; a second-conductive-type floating diffusion layer for receiving signal charges from the charge transfer section; and a detector transistor for detecting a potential change of the second-conductive-type floating diffusion layer, wherein the detector transistor has discontinuous first and second gate electrodes;

an opening is formed in the first gate electrode; and the opening is positioned above the second-conductive-type floating diffusion layer.

In this solid-state image sensor according to one embodiment of the invention, since the detector transistor has discontinuous first and second gate electrodes and the opening of the first gate electrode is positioned above the second-conductive-type floating diffusion layer, forming a metal line above the opening of the first gate electrode allows self alignment to be achieved, by which the second-conductive-type floating diffusion layer and the metal line are connected to each other. Therefore, the alignment margin between the second-conductive-type floating diffusion layer and the contact hole can be eliminated, so that the area of the second-conductive-type floating diffusion layer can be reduced. As a result, the junction capacitance between the second-conductive-type floating diffusion layer and the semiconductor substrate is decreased so that signal charges of the second-conductive-type floating diffusion layer can be detected at high sensitivity.

Also, there is provided a method for manufacturing the solid-state image sensor, comprising the steps of:

forming the gate electrode of the detector transistor by etching;

forming photoresist on the gate electrode and around the gate electrode so as to surround the opening of the gate electrode; and performing ion implantation with the photoresist and the gate electrode used as a mask to form the second-conductive-type floating diffusion layer below the opening of the gate electrode.

In the solid-state image sensor manufacturing method of this invention, since ion implantation is performed with the photoresist and the gate electrode used as a mask so that the second-conductive-type floating diffusion layer is formed below the opening of the gate electrode, self alignment is achieved so that the alignment margin for the second-conductive-type floating diffusion layer can be eliminated.

In one embodiment of the present invention, the second-conductive-type floating diffusion layer is formed in self alignment below the opening of the gate electrode.

In this solid-state image sensor manufacturing method according to one embodiment of the invention, since the second-conductive-type floating diffusion layer is formed in self alignment, the process becomes efficient.

In one embodiment of the present invention, the solid-state image sensor manufacturing method further comprises steps of: forming a contact hole in a planarization layer so as to be positioned above the opening of the gate electrode, and forming a metal line in the contact hole, by which the second-conductive-type floating diffusion layer and the gate electrode to each other with the metal line.

In this solid-state image sensor manufacturing method according to one embodiment of the invention, the contact hole is formed in the planarization layer so as to be positioned above the opening of the gate electrode, and the metal line is formed at the contact hole, by which the second-conductive-type floating diffusion layer and the gate electrode are connected to each other with the metal line. Thus, self alignment is achieved so that the alignment margin between the second-conductive-type floating diffusion layer and the contact hole can be eliminated.

In one embodiment of the present invention, the solid-state image sensor manufacturing method further comprises steps of: forming the first and second gate electrodes of the detector transistor by etching; forming photoresist on the first gate electrode and around the first gate electrode so as to surround the opening of the first gate electrode; and performing ion implantation with the photoresist and the first gate electrode used as a mask to form the second-conductive-type floating diffusion layer below the opening of the first gate electrode.

In this solid-state image sensor manufacturing method according to one embodiment of the invention, since ion implantation is performed with the photoresist and the first gate electrode used as a mask so that the second-conductive-type floating diffusion layer is formed below the opening of the first gate electrode, self alignment is achieved so that the alignment margin for the second-conductive-type floating diffusion layer can be eliminated.

In one embodiment of the present invention, the first and second gate electrodes are formed in one step.

In this solid-state image sensor manufacturing method according to one embodiment of the invention, since the first and second gate electrodes are formed simultaneously by one step, the solid-state image sensor can be manufactured efficiently.

In one embodiment of the present invention, the second-conductive-type floating diffusion layer is formed in self alignment below the opening of the first gate electrode.

In this solid-state image sensor manufacturing method according to one embodiment of the invention, since the second-conductive-type floating diffusion layer is formed in self alignment, the process becomes more efficient.

In one embodiment of the present invention, the solid state image sensor manufacturing method further comprises steps of: forming a contact hole in a planarization layer so that the contact hole is positioned above the opening of the first gate electrode, and forming a metal line in the contact hole, by which the second-conductive-type floating diffusion layer and the first gate electrode are connected to each other with the metal line.

In this solid-state image sensor manufacturing method according to one embodiment of the invention, the contact hole is formed in the planarization layer so as to be positioned above the opening of the first gate electrode, and the metal line is formed at the contact hole, by which the second-conductive-type floating diffusion layer and the first gate electrode are connected to each other with the metal line. Thus, self alignment is achieved so that the alignment margin between the second-conductive-type floating diffusion layer and the contact hole can be eliminated.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Hereinbelow, CCDs of the present invention are described in detail by way of embodiments thereof illustrated in the accompanying drawings.

First Embodiment

Figure 1A:
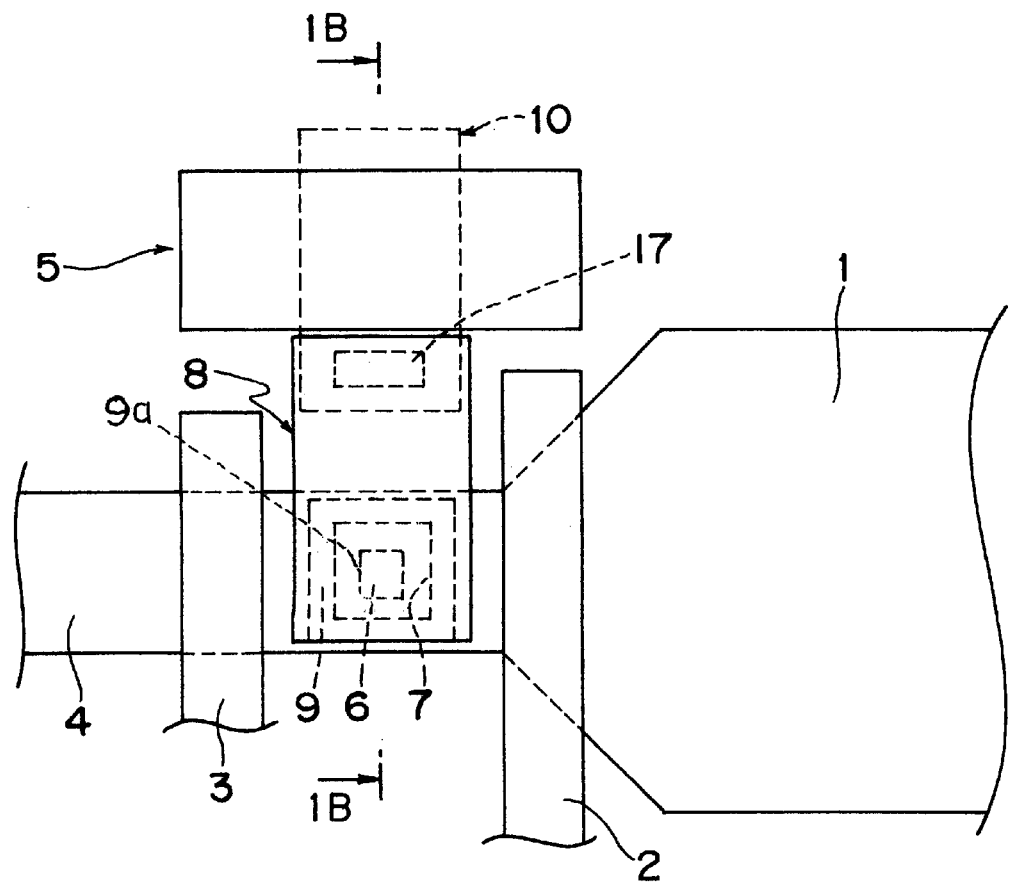
FIG. 1A is a plan view of a solid-state image sensor according to a first embodiment of the present invention and FIG. 1B is a sectional view taken along the line 1B—1B of FIG. 1A.
Figure 1B:
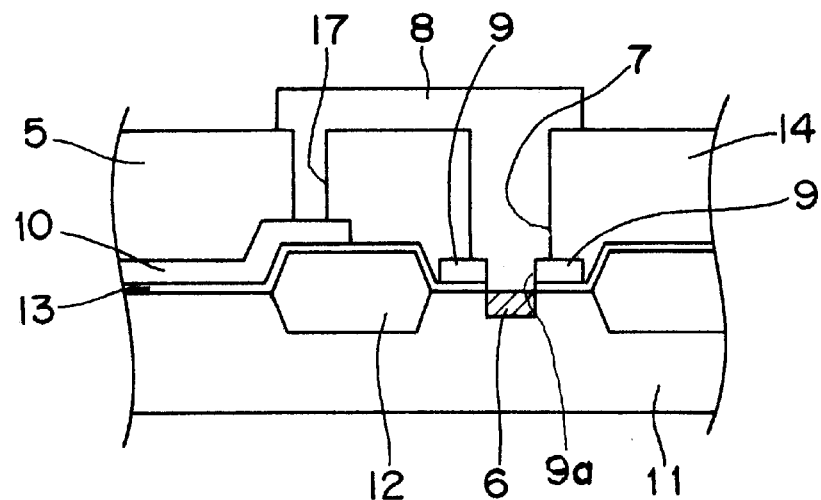

FIG. 1A is a plan view of main part of the CCD according to a first embodiment of the present invention and FIG. 1B is a sectional view taken along the line 1B—1B of FIG. 1A.

As shown in FIGS. 1A and 1B, this CCD has a P-type semiconductor substrate 11 serving as a first-conductive-type semiconductor substrate, a horizontal transfer section 1 serving as a charge transfer section formed on the P-type semiconductor substrate 11, an FD 6 serving as a second-conductive-type floating diffusion layer for receiving signal charges from the horizontal transfer section 1, and a detector MOSFET 5 serving as a detector transistor for detecting any potential change of the FD 6. For resetting the FD 6, the reset pulse voltage applied to the reset gate 3 is made high level. For transferring signal charges from the horizontal transfer section 1 to the FD 6, the reset pulse voltage of the reset gate 3 is made low level. It is noted that reference numeral 2 denotes a horizontal output gate.

The detector MOSFET 5, as shown in FIG. 1B, has discontinuous first and second gate electrodes 9, 10. In this first gate electrode 9, an opening 9a is formed so as to be positioned above the FD 6. Also, a contact hole 7 is formed in a planarization film 14 serving as a planarization layer so as to be positioned above the opening 9a. Moreover, a contact hole 17 is formed in the planarization film 14 so as to be positioned above a first gate electrode 9 side end portion of the second gate electrode 10. A material of an aluminum line 8 serving as a metal line is filled into the contact holes 7, 17, by which the aluminum line 8 is formed at the contact holes 7, 17. The aluminum line 8, which closes the contact hole 7, connects the first gate electrode 9 and the FD 6 to each other. Reference numeral 12 denotes field oxide, 13 denotes gate oxide and 14 denotes a planarization film.

According to the CCD of this constitution, since the detector MOSFET 5 has the discontinuous first, second gate electrodes 9, 10, where the opening 9a of the first gate electrode 9 is positioned on the FD 6, forming the aluminum line 8 on the opening 9a allows self alignment to be achieved, by which the FD 6 and the aluminum line 8 are -connected to each other. Therefore, the alignment margin between the FD 6 and contact hole 7 can be eliminated, so that the area of the FD 6 can be reduced. As a result, the junction capacitance between the FD 6 and the semiconductor substrate 11 is decreased so that signal charges of the FD 6 can be detected at high sensitivity.

This CCD is manufactured as follows.

First, by LOCOS (LOCal Oxidation of Silicon) process, the field oxide 12 is formed on the P-type semiconductor substrate 11 and then the gate oxide 13 is formed on the field oxide 12.

Next, on the gate oxide 13, material of the first and second gate electrodes 9, 10 of the detector MOSFET 5 is stacked and etched, by which the first gate electrode 9 having the opening 9a and the second gate electrode 10 are formed at the same time, hence the process is efficient.

Next, photoresist is formed on the first gate electrode 9 and around the first gate electrode 9 so as to surround the opening 9a of the first gate electrode 9. Then, ion implantation is performed with the photoresist and the gate electrode 9 used as a mask, by which an $N^+$ layer, which is the FD 6, is formed below the opening 9a. Therefore, since the FD 6 is formed in self alignment, the process becomes more efficient. In this process, in the photoresist, an opening corresponding to the opening 9a has only to be larger than the opening 9a by an extent corresponding to a margin for manufacturing variations.

Next, after removal of the photoresist, the planarization film 14 is stacked on the first gate electrode 9, and the planarization film 14 is etched selectively, by which the contact hole 7 is formed in the planarization film 14 above the opening 9a of the first gate electrode 9. Also, the contact hole 17 is formed in the planarization film 14 above the first gate electrode 9 side end portion of the second gate electrode 10. In this process, the contact hole 7 may be formed so as to be larger than the opening 9a of the first gate electrode 9 by an extent of manufacturing variation. Then, the aluminum line 8 is formed by filling the material of the aluminum line 8 into the contact hole 7, by which the first gate electrode 9 and the FD 6 are connected to each other via the aluminum line 8.

Thus, since the FD 6 is formed below the opening 9a by performing ion implantation with the photoresist and the gate electrode 9 used as a mask, self alignment is achieved so that the alignment margin for the FD 6 can be eliminated.

Further, since the FD 6 and the first gate electrode 9 are connected to each other by forming the contact hole 7 in the planarization film 14 above the opening 9a and by forming the aluminum line 8 at the contact hole 7, self alignment is achieved so that alignment margin between the FD 6 and the contact hole 7 can be eliminated.

Although the opening 9a is formed in the first gate electrode 9 in this embodiment, it is also possible to form a cutout in the first gate electrode and form the FD below the cutout. That is, the term, opening, here refers to one which is surrounded in its major part by the first gate electrode.

Second Embodiment

Figure 2A:
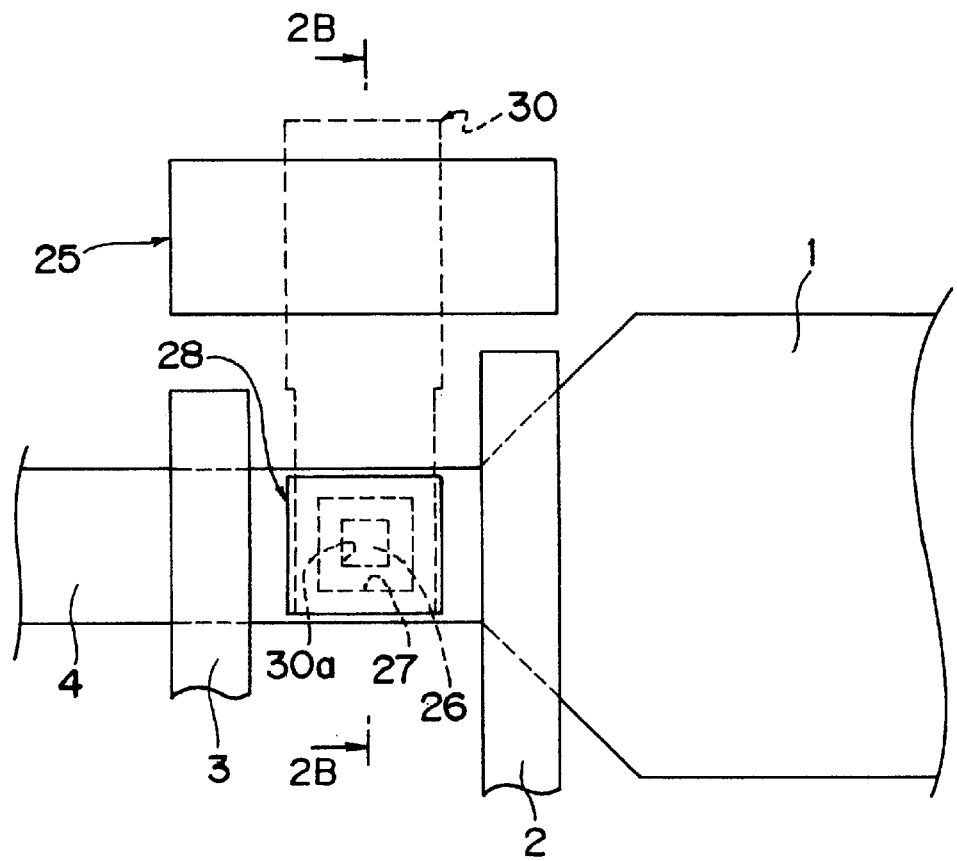
FIG. 2A is a plan view of a solid-state image sensor according to a second embodiment of the present invention and FIG. 2B is a sectional view taken along the line 2B—2B of FIG. 2A.
Figure 2B:
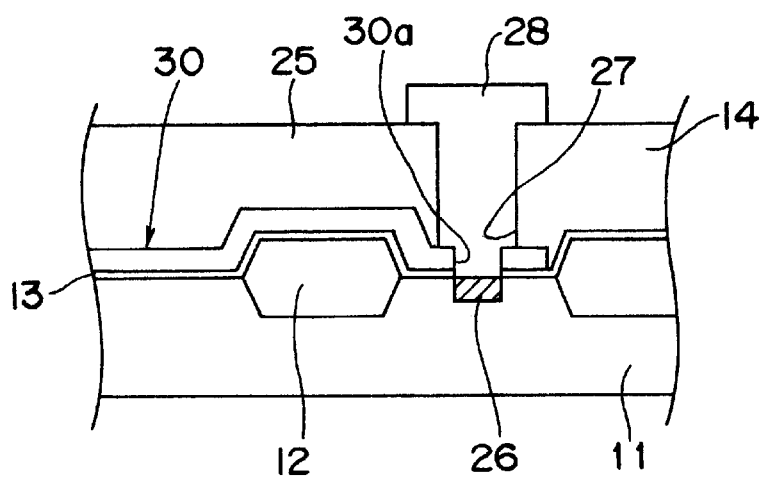

FIG. 2A is a plan view of main part of a CCD according to a second embodiment of the present invention and FIG. 2B is a sectional view taken along the line 2B—2B of FIG. 2A. In FIGS. 2A and 2B, the same component parts as those of FIGS. 1A and 1B are designated by the same reference numerals.

As shown in FIGS. 2A and 2B, this CCD has a P-type semiconductor substrate 11 serving as a first-conductive-type semiconductor substrate, a horizontal transfer section 1 serving as a charge transfer section formed on the P-type semiconductor substrate 11, an FD 26 serving as a second-conductive-type floating diffusion layer for receiving signal charges from the horizontal transfer section 1, and a detector MOSFET 25 serving as a detector transistor for detecting any potential change of the FD 26. For resetting the FD 26, the reset pulse voltage applied to the reset gate 3 is made high level. For transferring signal charges from the horizontal transfer section 1 to the FD 26, the reset pulse voltage of the reset gate 3 is made low level. It is noted that reference numeral 2 denotes a horizontal output gate.

The detector MOSFET 25, as shown in FIG. 2B, has a gate electrode 30 having an opening 30a formed therein.

This gate electrode 30 extends toward the FD 26 and the opening 30a is positioned above the FD 26. Also, a contact hole 27 is formed in a planarization film 14 serving as a planarization layer so as to be positioned above the opening 30a. The contact hole 27 is closed by a material of an aluminum line 28 serving as a metal line, by which the aluminum line 28 is formed. This aluminum line 28 connects the gate electrode 30 and the FD 26 to each other. Reference numeral 12 denotes field oxide, 13 denotes gate oxide and 14 denotes a planarization film.

According to the CCD of this constitution, since the opening 30a of the gate electrode 30 of the detector MOSFET 25 is positioned above the FD 26, forming the aluminum line 28 on the opening 30a allows self alignment to be achieved, by which the FD 26 and the aluminum line 28 are connected to each other. Therefore, the alignment margin between the FD 26 and contact hole 27 can be eliminated so that the area of FD 26 can be reduced. As a result, the junction capacitance between the FD 26 and the semiconductor substrate 11 is decreased so that signal charges of the FD 26 can be detected at high sensitivity.

FIGS. 3A—3D are process views of the manufacturing method for the above-described CCD. This CCD is manufactured as follows.

Figure 3A:
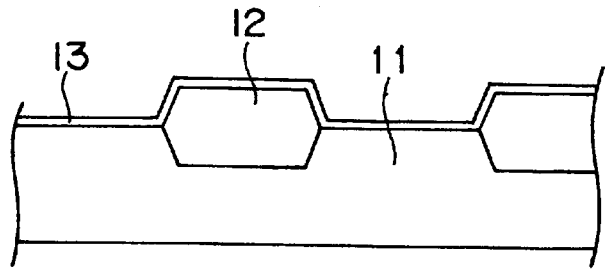
FIGS. 3A–3D are process views of the manufacturing method for the solid-state image sensor of the second embodiment.

First, as shown in FIG. 3A, by LOCOS (LOCal Oxidation of Silicon) process, the field oxide 12 is formed on the P-type semiconductor substrate 11 and then the gate oxide 13 is formed on the field oxide 12.

Figure 3B:
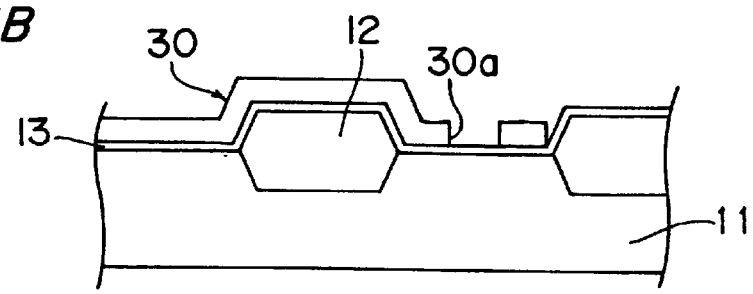

Next, as shown in FIG. 3B, on the gate oxide 13, material of the gate electrode 30 of the detector MOSFET 25 is stacked and etched, by which the gate electrode 30 having the opening 30a is formed.

Figure 3C:
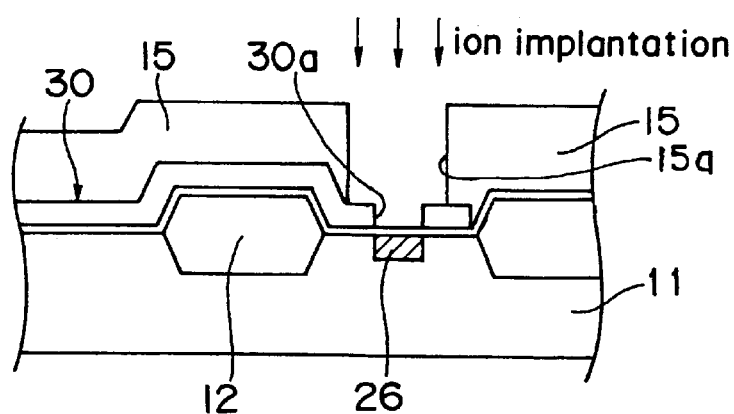

Next, as shown in FIG. 3C, photoresist 15 is stacked on the gate electrode 30 and around the gate electrode 30 so as to surround the opening 30a of the gate electrode 30. Then, ion implantation is performed with the photoresist 15 and the gate electrode 30 used as a mask, by which an $N^+$ layer, which is the FD 26, is formed below the opening 30a. Therefore, since the FD 26 is formed in self alignment, the process is efficient. In this process, in the photoresist 15, an opening 15a corresponding to the opening 30a has only to be larger than the opening 30a by an extent corresponding to a margin for manufacturing variations.

Figure 3D:
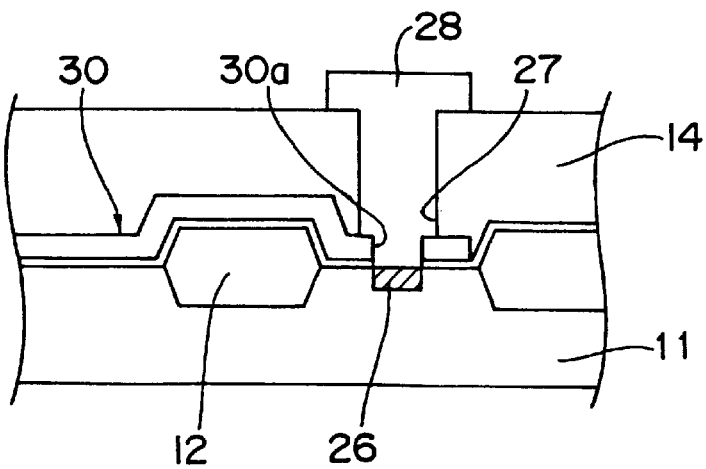
Figure 4A:
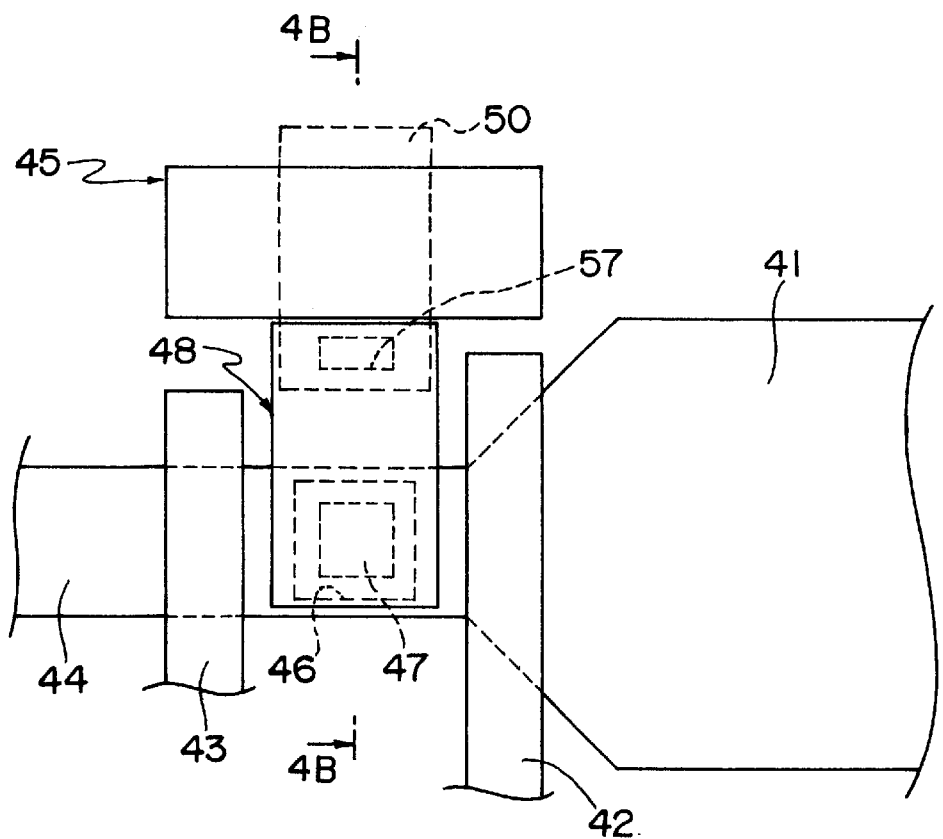
FIG. 4A is a plan view of a solid-state image sensor according to the prior art and FIG. 4B is a sectional view taken along the line 4B—4B of FIG. 4A.
Figure 4B:
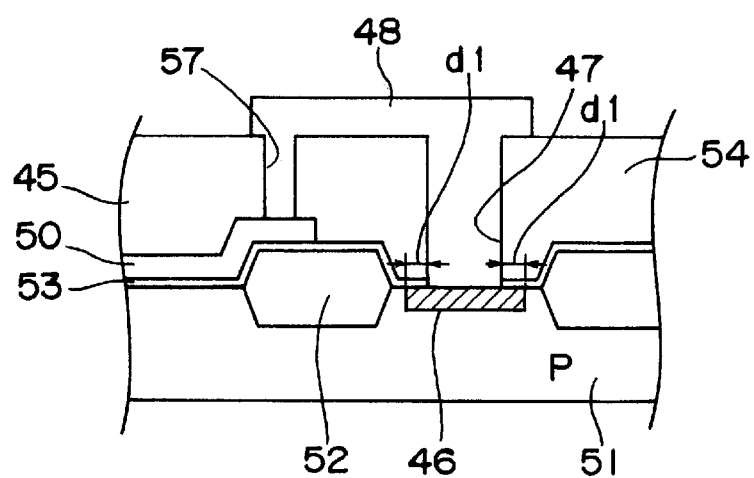
Figure 5A:
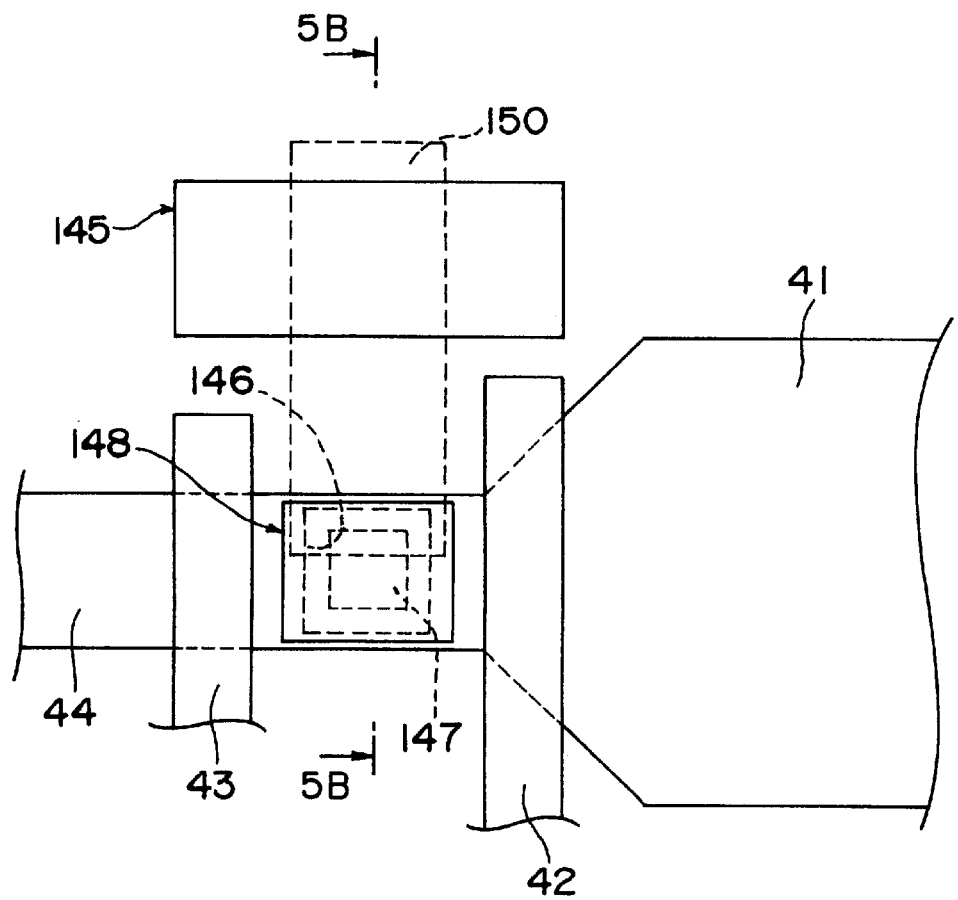
FIG. 5A is a plan view of another solid-state image sensor according to the prior art and FIG. 5B is a sectional view taken along the line 5B—5B of FIG. 5A.
Figure 5B:
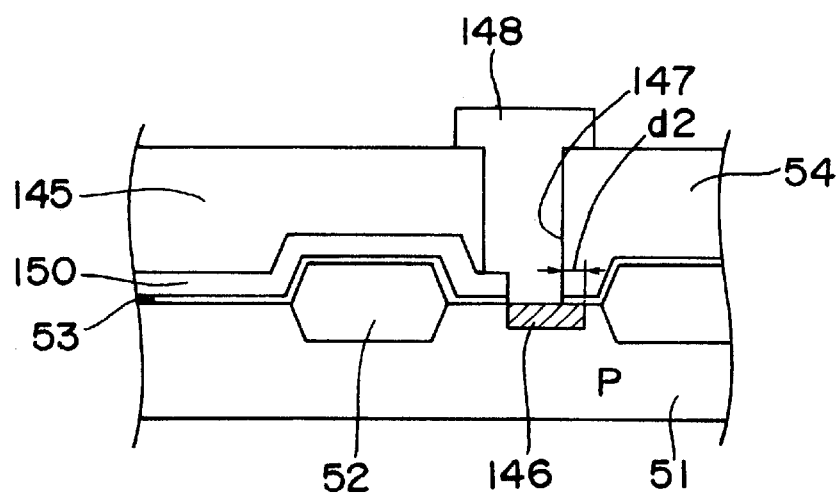

Next, after removal of the photoresist 15, as shown in FIG. 3D, the planarization film 14 is stacked on the gate electrode 30, and the planarization film 14 is etched selectively, by which the contact hole 27 is formed in the planarization film 14 above the opening 30a. In this process, the contact hole 27 may be formed so as to be larger than the opening 30a of the gate electrode 30 by an extent of manufacturing variation. Then, the aluminum line 28 is formed by filling the material of the aluminum line 28 into the contact hole 27, by which the gate electrode 30 and the FD 26 are connected to each other via the aluminum line 28.

Thus, since the FD 26 is formed below the opening 30a by performing ion implantation with the photoresist 15 and the gate electrode 30 used as a mask, self alignment is achieved so that the alignment margin for the FD 26 can be eliminated.

Further, since the FD 26 and the gate electrode 30 are connected to each other by forming the contact hole 27 in the planarization film 14 above the opening 30a and by forming the aluminum line 28 at the contact hole 27, self alignment is achieved so that alignment margin between the FD 26 and the contact hole 27 can be eliminated.

Although the opening 30a is formed in the first gate electrode 30 in this embodiment, it is also possible to form a cutout in the gate electrode and form the FD below the cutout. That is, the term, opening, here refers to one which is surrounded in its major part by the gate electrode.

It is noted here that the present invention may be changed in various ways within the scope defined by the appended claims, and is not limited to the first and second embodiments described above.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A solid-state image sensor comprising:
   a first-conductive-type semiconductor substrate;
   a charge transfer section formed on the first-conductive-type semiconductor substrate;
   a second-conductive-type floating diffusion layer for receiving signal charges from the charge transfer section;
   a detector transistor for detecting a potential change of the second-conductive-type floating diffusion layer; and
   a gate electrode connected to the detector transistor, the gate electrode extending over the second-conductive-type floating diffusion layer and including an opening positioned above the second-conductive-type floating diffusion layer for connecting the gate electrode to the second-conductive-type floating diffusion layer.

2. The solid-state image sensor of claim 1, further including an aluminum line that connects the gate electrode to the second-conductive-type floating diffusion layer.

3. A solid-state image sensor comprising:
   a first-conductive-type semiconductor substrate;
   a charge transfer section formed on the first-conductive-type semiconductor substrate;
   a second-conductive-type floating diffusion layer for receiving signal charges from the charge transfer section;
   a detector transistor for detecting a potential change of the second-conductive-type floating diffusion layer; and
   discontinuous first and second gate electrodes, wherein the second gate electrode is connected to the detector transistor, and the first gate electrode extends over the second-conductive-type floating diffusion layer and includes an opening positioned above the second-conductive-type floating diffusion layer for connecting the gate electrode to the second-conductive-type floating diffusion layer.

4. The solid-state image sensor of claim 3, further including an aluminum line that connects the first gate electrode to the second-conductive-type floating diffusion layer.

* * * * *